(12) United States Patent
Kim

(10) Patent No.: US 7,785,925 B2
(45) Date of Patent: Aug. 31, 2010

(54) INTEGRATED CIRCUIT PACKAGING SYSTEM WITH PACKAGE STACKING AND METHOD OF MANUFACTURE THEREOF

(75) Inventor: Geun Sik Kim, Gilbert, AZ (US)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/340,638

(22) Filed: Dec. 19, 2008

(65) Prior Publication Data

US 2010/0155918 A1    Jun. 24, 2010

(51) Int. Cl.
*H01L 21/44* (2006.01)
(52) U.S. Cl. .................. 438/106; 438/107; 438/108; 438/109; 438/111; 438/122; 257/E21.499; 257/E21.502
(58) Field of Classification Search .................. None
See application file for complete search history.

(56) References Cited

U.S. PATENT DOCUMENTS

| | | | |
|---|---|---|---|
| 6,972,481 B2 * | 12/2005 | Karnezos | .................... 257/686 |
| 7,420,269 B2 | 9/2008 | Ha et al. | |
| 2006/0256525 A1 | 11/2006 | Shim et al. | |
| 2007/0065987 A1 * | 3/2007 | Mess et al. | .................... 438/109 |
| 2007/0108581 A1 | 5/2007 | Shim et al. | |
| 2007/0218588 A1 | 9/2007 | Takiar et al. | |
| 2007/0241453 A1 * | 10/2007 | Ha et al. | ...................... 257/723 |
| 2007/0296086 A1 | 12/2007 | Ju et al. | |
| 2008/0073770 A1 | 3/2008 | Yee et al. | |
| 2008/0136006 A1 | 6/2008 | Jang et al. | |
| 2008/0136007 A1 | 6/2008 | Kim et al. | |

* cited by examiner

*Primary Examiner*—N Drew Richards
*Assistant Examiner*—Kyoung Lee
(74) *Attorney, Agent, or Firm*—Mikio Ishimaru

(57) ABSTRACT

A method of manufacture of an integrated circuit packaging system includes: providing a stack board with a side having a connect contact next to a connect edge and a top contact next to a top edge perpendicular to the connect edge, and a bottom contact on an opposite side; mounting a circuit assembly having an assembly end next to the connect contact and an edge pad over the stack board; connecting the edge pad with the stack board; and applying an edge encapsulant over the connect contact and over the assembly end with the edge encapsulant extending no more than half the width of the stack board.

20 Claims, 3 Drawing Sheets

INTEGRATED CIRCUIT PACKAGING SYSTEM WITH PACKAGE STACKING AND METHOD OF MANUFACTURE THEREOF

TECHNICAL FIELD

The present invention relates generally to an integrated circuit packaging system, and more particularly to a system for a package on package stack.

BACKGROUND ART

The integrated circuit package is the building block used in a high performance electronic system to provide applications for usage in products such as automotive vehicles, pocket personal computers, intelligent portable military devices, aeronautical spacecraft payloads, and a vast line of other similar products that require small compact electronics supporting many complex functions.

The integrated circuit package can include a package base or package substrate providing a mounting structure for attachment of at least one chip or die and an enclosure such as an epoxy applied on it to protect its contents. Typically, one side of the chip or die is used primarily for the mounting the chip or die.

The other side of the chip or die, referred to as an active surface of the chip or die, has electrically conductive areas that provide for electrical connections to its circuitry. Connectors, consisting of electrically conductive material, attach to the conductive areas to provide electrical connection between the circuitry of the chip or die and other circuitry not of the same chip or die.

The other circuitry can be from several possible sources. One possible source can be circuitry resident within the integrated circuit package, such as from another chip, indicative of a multiple chip integrated circuit package. Another possible source can be of circuitry residing outside the integrated circuit package such as from a printed circuit board within the electronic system.

Yet another possible source can be circuitry from one or more separate integrated circuit packages having one or more chips or dice within it. The separate integrated circuit packages can be connected with the conductors and enclosed together resulting in a single sealed package structure, externally connected onto the single sealed package structure, or simply individually connected together as separate structures. Integrated circuit packages with small footprints and high internal IO connectivity are sought after for products with small printed circuit board systems. Global market demands also require solutions that provide lower costs and higher reliability through simplified manufacturing processing and early testing of circuitry for known good die (KGD) during fabrication which result in higher yield and improved circuitry reliability. In addition, the advantage and flexibility provided by replacing package components as needed contribute to market leadership.

Attempts have failed to provide a complete solution addressing simplified manufacturing processing, smaller dimensions, lower costs due to design flexibility, reduced package counts, increased functionality, leveragability, and increased IO connectivity capabilities.

In view of the ever-increasing commercial competitive pressures, along with growing consumer expectations and the diminishing opportunities for meaningful product differentiation in the marketplace, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a stack board with a side having a connect contact next to a connect edge and a top contact next to a top edge perpendicular to the connect edge, and a bottom contact on an opposite side; mounting a circuit assembly having an assembly end next to the connect contact and an edge pad over the stack board; connecting the edge pad with the stack board; and applying an edge encapsulant over the connect contact and over the assembly end with the edge encapsulant extending no more than half the width of the stack board.

The present invention provides an integrated circuit packaging system including: a stack board with a side having a connect contact next to a connect edge and a top contact next to a top edge perpendicular to the connect edge, and a bottom contact on an opposite side; a circuit assembly having an assembly end mounted next to the connect contact and an edge pad over the stack board; the edge pad connected with the stack board; and an edge encapsulant applied over the connect contact and over the assembly end with the edge encapsulant extending no more than half the width of the stack board.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
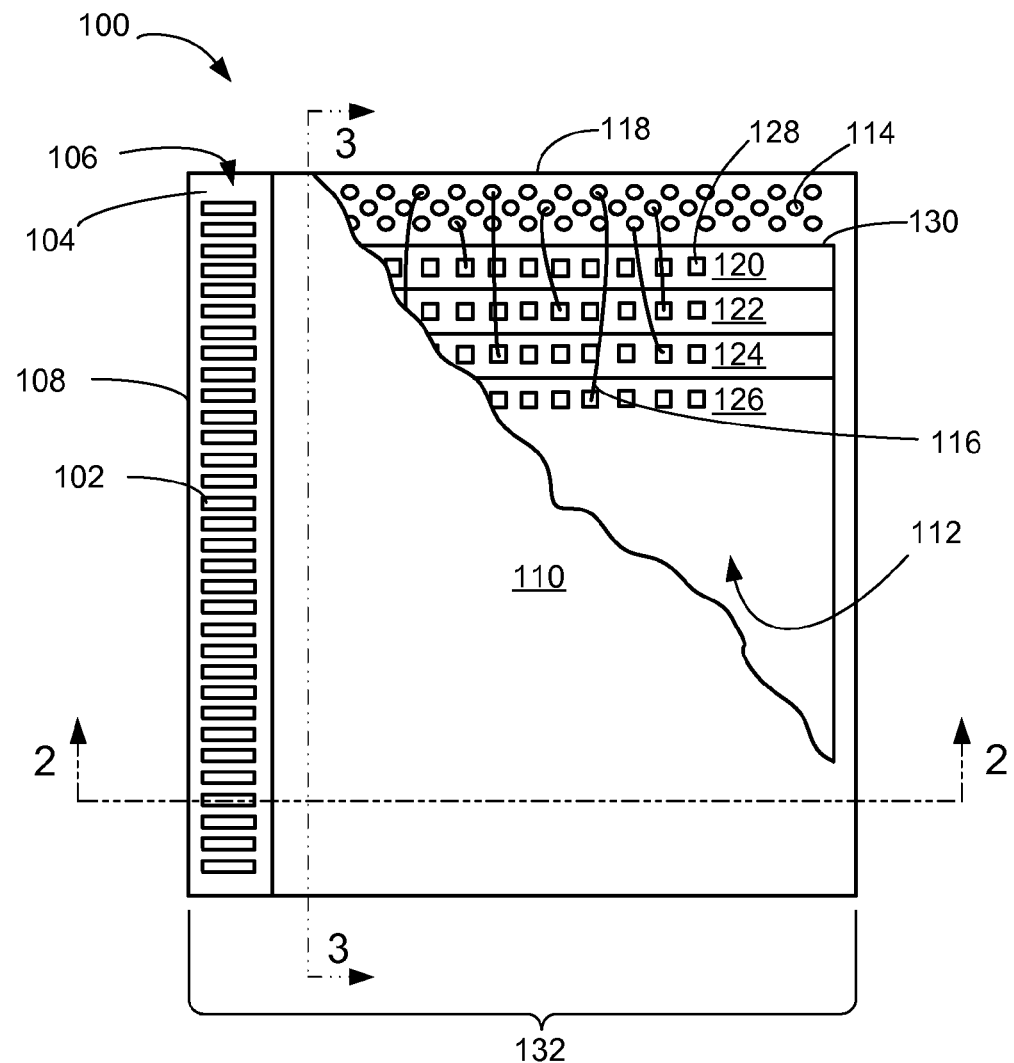
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can preferably include a package 132 having connect contacts 102 exposed on a top surface 104 of a stack board 106, such as a circuit board, aligned parallel to and next to a connect edge 108 of the stack board 106 adjacent an encapsulant 110. The connect contacts 102 can be rectangular in shape having a length projecting perpendicularly away from the connect edge 108 of the stack board 106. The connect contacts 102 can have connectivity with the conductive materials within the stack board 106. Note the shape, size, or distribution pattern of the connect contacts 102 is non-restrictive or non-limiting for the present invention.

For purposes of illustration, a diagonal portion of the encapsulant 110 is removed down to the top surface 104 of the stack board 106 to show a circuit assembly 112 such as at least one chip or module, top contacts 114 exposed on the top surface 104, and interconnects 116 such as bond wires or similar connective technology. The top contacts 114 can be located next to and parallel to a top edge 118 of the stack board 106. The top contacts 114 can have connectivity with the conductive materials within the stack board 106. The top edge 118 is perpendicular to the connect edge 108 of the stack board 106. Note the shape, size, or distribution pattern of the top contacts 114 is non-restrictive or non-limiting for the present invention.

The circuit assembly 112 can include a first die 120, a second die 122, a third die 124, and a fourth die 126 covered with the encapsulant 110. The first die 120 includes edge pads 128 exposed on one surface parallel to and next to a die edge 130 of the first die 120. The second die 122 includes edge pads 128 exposed on one surface parallel to and next to the die edge 130 of the second die 122. The third die 124 includes the edge pads 128 exposed on one surface parallel to and next to the die edge 130 of the third die 124. The fourth die 126 includes the edge pads 128 exposed on one surface parallel to and next to the die edge 130 of the fourth die 126.

The first die 120, the second die 122, the third die 124, and the fourth die 126 can have identical physical geometric dimensions. The first die 120, the second die 122, the third die 124, and the fourth die 126 can be stacked over one another and oriented having the edge pads 128 facing away from the top surface 104. Two opposing sides of the first die 120, of the second die 122, of the third die 124, and of the fourth die 126 can be aligned vertically over one another. The die edge 130 of the first die 120, the second die 122, the third die 124, and the fourth die 126 can individually be oriented next to and offset away from the top edge 118 exposing the edge pads 128.

The interconnects 116 can be used to connect the edge pads 128 of the first die 120, the second die 122, the third die 124, and the fourth die 126 of the circuit assembly 112 with the top contacts 114 of the stack board 106.

Figure 2:
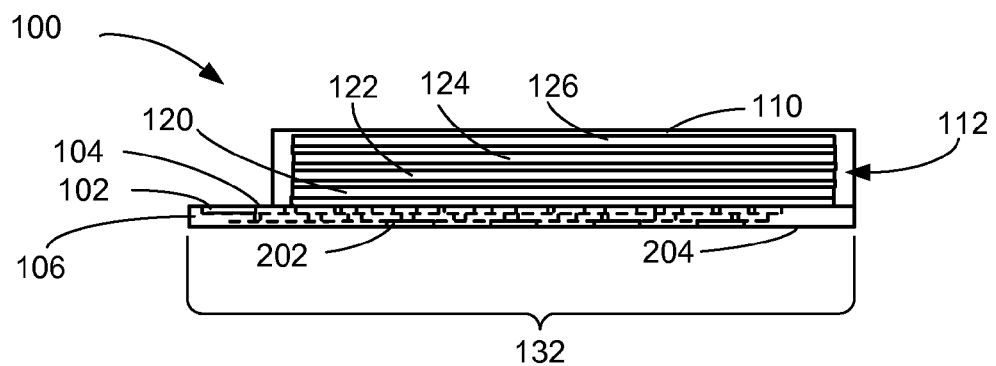
FIG. 2 is a front cross-sectional view of the integrated circuit packaging system taken along a line 2-2 of FIG. 1.

Referring now to FIG. 2, therein is shown a front cross-sectional view of the integrated circuit packaging system 100 taken along a line 2-2 of FIG. 1. The package 132 can preferably include bottom contacts 202 exposed on a bottom surface 204 of the stack board 106, the connect contacts 102 exposed on the top surface 104, and the circuit assembly 112 mounted over the top surface 104 next to the connect contacts 102 and covered with the encapsulant 110.

The stack board 106 can include conductive materials distributed between the top surface 104 and the bottom surface 204 used to provide connectivity within the stack board 106 as well as with the connect contacts 102, the bottom contacts 202 and the top contacts 114 of FIG. 1.

The two opposing sides of the first die 120, of the second die 122, of the third die 124, and of the fourth die 126 of the circuit assembly 112 are shown aligned vertically over one another. The first die 120, the second die 122, the third die 124, and the fourth die 126 can each have connectivity with the top contacts 114. The first die 120, the second die 122, the third die 124, the fourth die 126, the top contacts 114 and the interconnects 116 can be covered with the encapsulant 110.

The bottom contacts 202 or the connect contacts 102 can be used to test or characterize the circuitry within the integrated circuit packaging system 100. Note the quantity, location, shape, size, or distribution pattern of the bottom contacts 202 is non-restrictive or non-limiting for the present invention and can be modified to accommodate vast connectivity technologies such as land grid array (LGA), solder on pad (SOP), pressure contact pin (PCP), or other emerging technologies.

It has been discovered that the connect contacts 102 or the bottom contacts 202 can greatly simplify and improve testing by providing multiple test access methods such as bed-of-nails probes to the bottom contacts 202, spring contact edge connector to the connect contacts 102, or any various other mount and connect combinations.

It has been unexpectedly found that the availability of the connect contacts 102 or the bottom contacts 202 can significantly improve test and characterization capabilities due to support of advanced testing techniques such as with simultaneous active stimulus passive monitoring (ASPM) testing.

Thus, it has been discovered that the integrated circuit packaging system 100 of the present invention furnishes important and heretofore unknown and unavailable solutions, capabilities, and functional aspects for package on package products.

Figure 3:
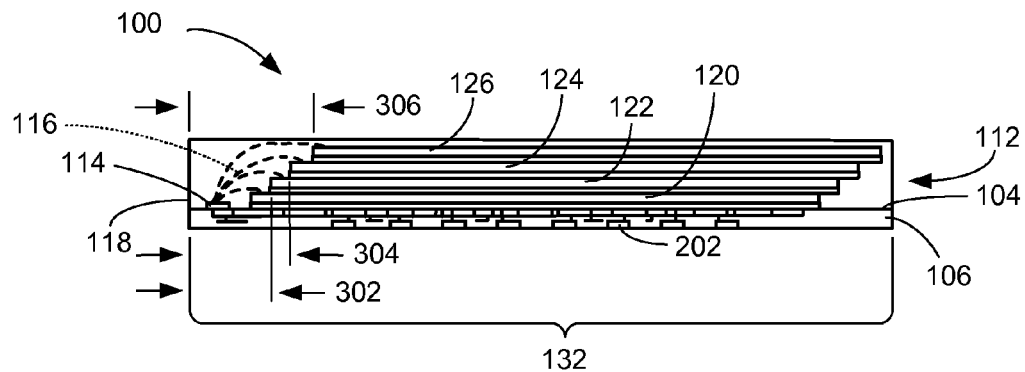
FIG. 3 is a side cross-sectional view of the integrated circuit packaging system taken along a line 3-3 of FIG. 1.

Referring now to FIG. 3, therein is shown a side cross-sectional view of the integrated circuit packaging system 100 taken along a line 3-3 of FIG. 1. The package 132 is shown having the second die 122 mounted over the first die 120 with a first horizontal offset 302 from the top edge 118 exposing the edge pads 128 of FIG. 1 of the first die 120. The third die 124 mounted over the second die 122 with a second horizontal offset 304 from the top edge 118 exposing the edge pads 128 of the second die 128. The fourth die 126 mounted over the third die 124 with a third horizontal offset 306 exposing the edge pads 128 of the third die 124.

Figure 4:
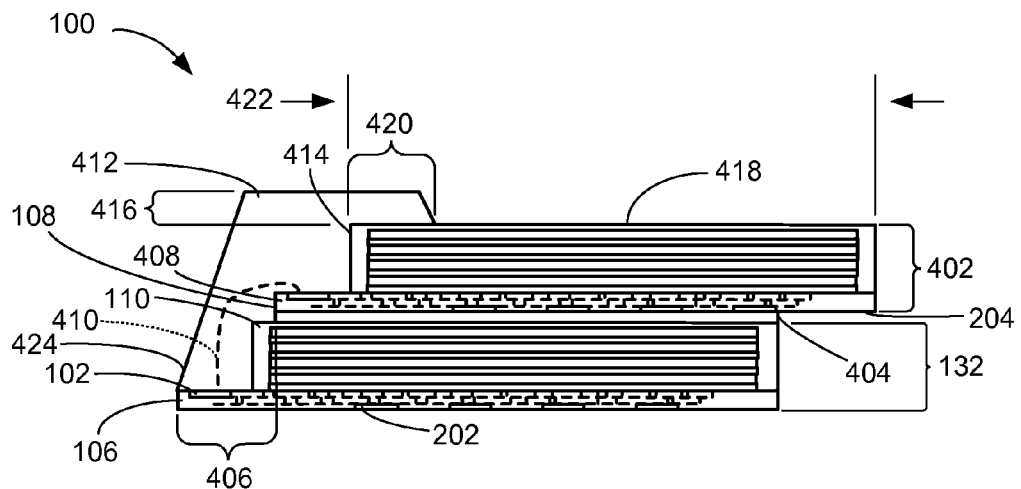
FIG. 4 is a view similar to FIG. 2 in a stack encapsulation phase.

Referring now to FIG. 4, therein is shown a view similar to FIG. 2 in a stack encapsulation phase. A stack package 402, such as an identical copy of the package 132, can be mounted over the package 132. The bottom contacts 202 on the bottom surface 204 of the stack package 402 or of the package 132 can be used to test the circuitry of the stack package 402 or the package 132 respectively.

The bottom surface 204 of the stack package 402 can be attached over the encapsulant 110 on the package 132 using an attachment layer 404 such as an epoxy paste. The connect edge 108 of the stack package 402 can be oriented in a direction towards the connect edge 108 of the package 132. The stack package 402 can have a horizontal stack offset 406 from an end next to the connect edge 108 of the package 132 towards the end opposite the end next to the connect edge 108 to expose the connect contacts 102 of the stack board 106.

The connect contacts 102 of the stack board 106 can be connected to the connect contacts 102 of a second stack board 408 of the stack package 402 using interconnects 410 such as bond wires or similar connective technology to provide connectivity between the package 132 and the stack package 402. Note that there are no requirements or restrictions regarding the content or functionality of the stack package 402 relative to the package 132. Similarly, there are no requirements or restrictions regarding connectivity or personalization of the conductive materials within the second stack board 408 of the stack package 402 or the stack board 106 of the package 132.

An edge encapsulant 412, such as the encapsulant 110 or a material having similar protective properties, can be applied over the connect contacts 102 of the package 132, over the interconnects 410, and over the connect contacts 102 of the stack package 402. The edge encapsulant 412 can rise above an assembly end 414 of the stack package 110 and over the encapsulant 110 on the stack package 402 to a height 416 above the encapsulant 110. The magnitude of the height 416 can be less than one-half the magnitude of the horizontal stack offset 406 and more than one-quarter the magnitude of the horizontal stack offset 406.

The edge encapsulant 412 can extend across a module top surface 418 up to a coverage distance 420 away from the assembly end 414 of the stack package 402. The magnitude of the coverage distance 420 is less than half a measured width 422 of the second stack board 408. The measured width 422 is defined as the measurement from the end of the connect edge 108 of the second stack board 408 to the end opposite the end next to the connect edge 108 of the second stack board 408 along a line perpendicular to the connect edge 108 of the second stack board 408.

An edge encapsulant side 424 next to the connect contacts 102 or a side opposite the edge encapsulant side 424 of the edge encapsulant 412 can be formed having an oblique angle relative to the stack board 106. The bottom contacts 202 of the stack board 106 can provide connectivity between the integrated circuit packaging system 100 and a next level of integration.

Figure 5:
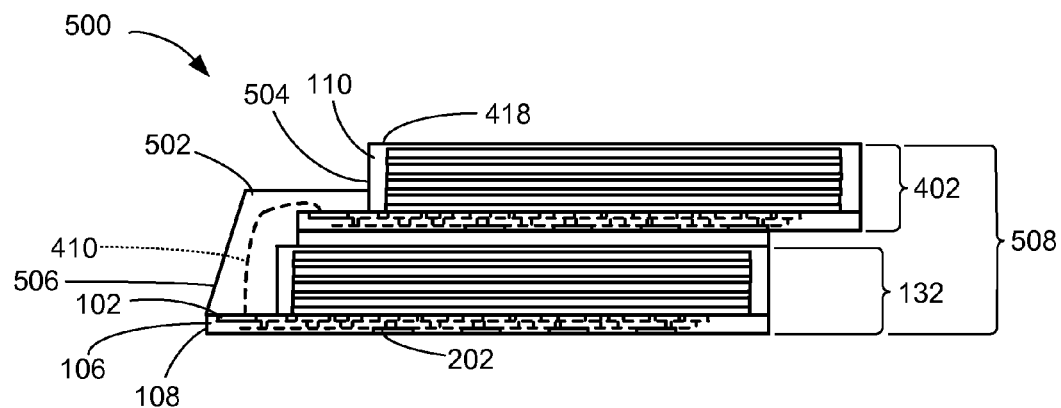
FIG. 5 is a view similar to FIG. 4 of an integrated circuit packaging system in a second embodiment of the present invention.

Referring now to FIG. 5, therein is shown a view similar to FIG. 4 of an integrated circuit packaging system 500 in a second embodiment of the present invention. The integrated circuit packaging system 500 is similar to the integrated circuit packaging system 100 except an edge encapsulant 502, such as the encapsulant 110 or a material having similar protective properties, is applied over the interconnects 410, over an assembly end 504 of the package 132, and over the connect contacts 102 of the stack package 402.

The overall height of the edge encapsulant 502 does not rise above the module top surface 418 of the stack package 402. The edge encapsulant 502 can be applied from the connect contacts 102 of the stack package 402 and extend horizontally to the assembly end 504 of the stack package 402. An edge encapsulant side 506 of the edge encapsulant 502 can be formed having an oblique angle relative to the stack board 106. The bottom contacts 202 of the package 132 can provide connectivity between the integrated circuit packaging system 500 and a next level of integration.

It has been discovered that having the edge encapsulant 502 below the module top surface 418 of the stack package 402 can result in significant material cost savings due to reduced application of the edge encapsulant 412 material and improved package Z-height 508 characteristics.

Figure 6:
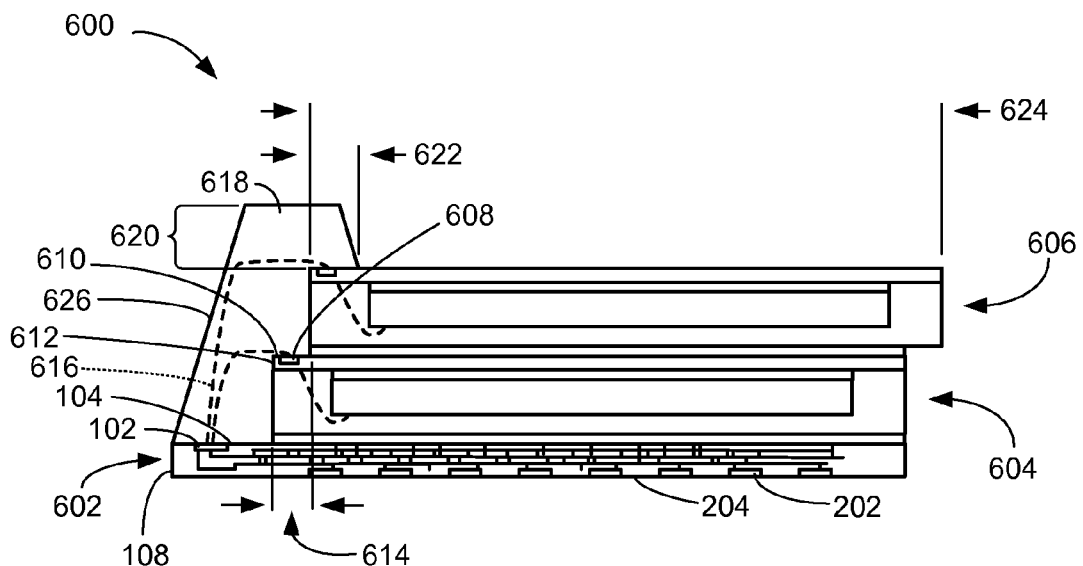
FIG. 6 is a view similar to FIG. 4 of an integrated circuit packaging system in a third embodiment of the present invention.

Referring now to FIG. 6, therein is shown a view similar to FIG. 4 of an integrated circuit packaging system 600 in a third embodiment of the present invention. The integrated circuit packaging system 600 can preferably include a stack board 602 having the connect contacts 102, the connect edge 108, the top contacts 114 of FIG. 1, the bottom contacts 202, a first module 604, and a second module 606. The connect contacts 102 can be exposed on the top surface 104 parallel to and next to the connect edge 108 of the stack board 602.

The stack board 602 can include conductive materials distributed between the top surface 104 and the bottom surface 204 used to provide connectivity within the stack board 602 as well as with the connect contacts 102, the top contacts 114, and the bottom contacts 202.

The first module 604, such as an internal stacking module or the circuit assembly 112 of FIG. 1, includes edge pads 608 exposed on a connective surface 610 of the first module 604, parallel with and next to an assembly end 612 of the first module 604. The first module 604 can be mounted with the assembly end 612 parallel with and next to the connect contacts 102 of the stack board 602 with the edge pads 608 of the first module 604 facing away from the top surface 104 of the stack board 602.

The second module 606, such as an internal stacking module or the circuit assembly 112, includes the edge pads 608 exposed on the connective surface 610 of the second module 606, parallel with and next to the assembly end 612 of the second module 606. The second module 606 can be mounted over the connectivity surface 610 of the first module 604 with the connectivity surface 610 of the second module 606 facing away from the top surface 612 of the stack board 602.

The assembly end 612 of the second module 606 can be oriented over the assembly end 612 of the first module 604. The second module 606 is positioned with a module offset 614 in a horizontal direction from the assembly end 612 to the end opposite the assembly end 612 of the first module 604. The magnitude of the module offset 614 can be chosen to ensure that the edge pads 608 of the first module 604 are substantially exposed adjacent the second module 606.

Interconnects 616 can be used to provide connectivity between the connect contacts 102 and the edge pads 608 of the first stack module 604 or the edge pads 608 of the second module 606. An edge encapsulant 618 such as the encapsulant 110 or a material having similar protective properties can be applied over the connect contacts 102 of the stack board 602, the interconnects 616, and the edge pads 608 of the second module 606. The edge encapsulant 618 can rise above the connectivity surface 610 of the second module 606 to a height 620. The magnitude of the height 620 can be greater than twice the magnitude of the module offset 614.

The edge encapsulant 618 can extend across the connectivity surface 610 of the second module 606 up to a coverage distance 622 away from the assembly end 612 of the second module 606. The magnitude of the coverage distance 622 is less than half a measured width 624 of the second module 606. The measured width 624 is defined as the measurement from the assembly end 612 of the second module 606 to the end opposite the assembly end 612 of the second module 606 along a line perpendicular to the assembly end 612 of the second module 606.

An edge encapsulant side 626 or a side opposite the edge encapsulant side 626 of the edge encapsulant 618 can be formed having an oblique angle relative to the stack board 602. The bottom contacts 202 of the stack board 602 can be used to provide connectivity between the integrated circuit packaging system 600 and a next level of integration.

Figure 7:
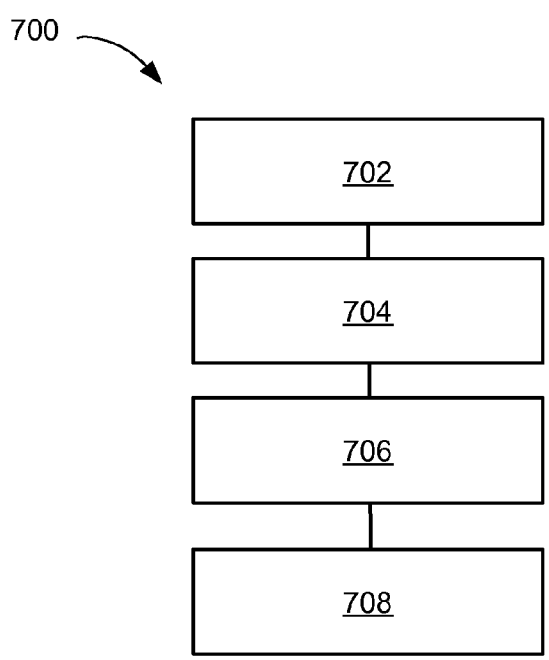
FIG. 7 is a flow chart of a method of manufacture of an integrated circuit packaging system in a further embodiment of the present invention.

Referring now to FIG. 7 therein is shown a flow chart of a method 700 of manufacture of an integrated circuit packaging system 100 in a further embodiment of the present invention. The method 700 includes providing a stack board with a side having a connect contact next to a connect edge and a top contact next to a top edge perpendicular to the connect edge, and a bottom contact on an opposite side in a block 702; mounting a circuit assembly having an assembly end next to the connect contact and an edge pad over the stack board in a block 704; connecting the edge pad with the stack board in a block 706; and applying an edge encapsulant over the connect contact and over the assembly end with the edge encapsulant extending no more than half the width of the stack board in a block 708.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package on package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a stack board with a side having a connect contact next to a connect edge and a top contact next to a top edge perpendicular to the connect edge, and a bottom contact on an opposite side;
   mounting a circuit assembly having an assembly end next to the connect contact and an edge pad over the stack board;
   connecting the edge pad with the stack board; and
   applying an edge encapsulant over the connect contact and over the assembly end with the edge encapsulant extending no more than half the width of the stack board.

2. The method as claimed in claim 1 wherein:
   forming the circuit assembly includes:
      mounting a first die with the edge pad adjacent to the top contact, and
      mounting a second die with another of the edge pad with an offset from the top
      edge to expose the edge pad of the first die; and
   connecting the edge pad of the first die and of the second die with the top contact and another of the top contact respectively.

3. The method as claimed in claim 1 wherein:
   applying the edge encapsulant over the connect contact and extended horizontally to the assembly end.

4. The method as claimed in claim 1 further comprising:
   providing a second circuit assembly having an assembly end, and an edge pad; and
   wherein:
   mounting the second circuit assembly with the assembly end next to the connect contact and an offset from the first circuit assembly; and
   connecting the edge pad of the second circuit assembly with the connect contact.

5. The method as claimed in claim 1 further comprising:
   providing a second stack board; and
   wherein:
   mounting the second stack board having another of the connect contact with an offset from the connect edge to expose the connect contact of the first stack board; and
   connecting the connect contact of the first stack board with the second stack board.

6. A method of manufacture of an integrated circuit packaging system comprising:
   providing a stack board having connectivity between a side having a connect contact next to a connect edge, having a top contact next to a top edge perpendicular to the connect edge, and an opposite side having a bottom contact;
   mounting a circuit assembly having a measured width with an assembly end next to the connect contact and an edge pad facing away from the stack board;
   connecting an interconnect between the edge pad and the stack board; and
   applying an edge encapsulant over the connect contact and over the assembly end with the edge encapsulant extending no more than half the measured width of the stack board.

7. The method as claimed in claim 6 wherein:
   forming the circuit assembly includes:
      mounting a first die with the edge pad oriented next to the top contact, and
      mounting a second die with another of the edge pad over the first die with a first horizontal offset from the top edge to expose the edge pad of the first die; and
   connecting the interconnect between the edge pad of the first die and of the second die with the top contact and another of the top contact respectively.

8. The method as claimed in claim 6 wherein:
   applying the edge encapsulant over the connect contact and extended horizontally to and not over the assembly end of the stack package.

9. The method as claimed in claim 6 further comprising:
   providing a second circuit assembly having an assembly end and an edge pad; and wherein:
mounting the second circuit assembly with the assembly end next to the connect contact and with a module offset from the assembly end of the first circuit assembly; and
connecting the interconnect between the edge pad and the connect contact.

10. The method as claimed in claim 6 further comprising:
providing a second stack board having another of the connect contact; and
wherein:
mounting the second stack board with a horizontal stack offset from the connect edge of the first stack board to expose the connect contact of the first stack board; and
connecting the interconnect between the connect contact of the first stack board and of the second stack board.

11. An integrated circuit packaging system comprising:
a stack board with a side having a connect contact next to a connect edge and a top contact next to a top edge perpendicular to the connect edge, and a bottom contact on an opposite side;
a circuit assembly having an assembly end mounted next to the connect contact and an edge pad over the stack board;
the edge pad connected with the stack board; and
an edge encapsulant applied over the connect contact and over the assembly end with the edge encapsulant extending no more than half the width of the stack board.

12. The system as claimed in claim 11 wherein:
the circuit assembly formed includes:
a first die with the edge pad mounted adjacent to the top contact, and
a second die with another of the edge pad mounted with an offset from the top edge to expose the edge pad of the first die; and
the edge pad of the first die and of the second die connected with the top contact and another of the top contact respectively.

13. The system as claimed in claim 11 wherein:
the edge encapsulant applied over the connect contact and extended horizontally to the assembly end.

14. The system as claimed in claim 11 further comprising:
a second circuit assembly having an assembly end, and an edge pad; and
wherein:
the second circuit assembly mounted with the assembly end next to the connect contact and an offset from the first circuit assembly; and
the edge pad of the second circuit assembly connected with the connect contact.

15. The system as claimed in claim 11 further comprising:
a second stack board; and
wherein:
the second stack board having another of the connect contact mounted with an offset from the connect edge to expose the connect contact of the first stack board; and
connect contact of the first stack board connected with the second stack board.

16. The system as claimed in claim 11 wherein:
the stack board having connectivity between the side having the connect contact next to the connect edge, having the top contact next to the top edge perpendicular to the connect edge, and the opposite side having the bottom contact;
the circuit assembly having a measured width with the assembly end mounted next to the connect contact and the edge pad facing away from the stack board;
the edge encapsulant applied over the connect contact and over the assembly end with the edge encapsulant extending no more than half the measured width of the stack board; and
further comprising an interconnect connected between the edge pad and the stack board.

17. The system as claimed in claim 16 wherein:
the circuit assembly formed includes:
a first die with the edge pad mounted and oriented next to the top contact, and
a second die with another of the edge pad mounted over the first die with a first horizontal offset from the top edge to expose the edge pad of the first die; and
the interconnect connected between the edge pad of the first die and of the second die with the top contact and another of the top contact respectively.

18. The system as claimed in claim 16 wherein:
the edge encapsulant applied over the connect contact and extended horizontally to and not over the assembly end of the stack package.

19. The system as claimed in claim 16 further comprising:
a second circuit assembly having an assembly end and an edge pad; and
wherein:
the second circuit assembly with the assembly end mounted next to the connect contact and with a module offset from the assembly end of the first circuit assembly; and
the interconnect connected between the edge pad and the connect contact.

20. The system as claimed in claim 16 further comprising:
a second stack board having another of the connect contact; and
wherein:
the second stack board mounted with a horizontal stack offset from the connect edge of the first stack board to expose the connect contact of the first stack board; and
the interconnect connected between the connect contact of the first stack board and of the second stack board.

* * * * *